US010135497B2

(12) United States Patent
Kim et al.

(10) Patent No.: US 10,135,497 B2
(45) Date of Patent: Nov. 20, 2018

(54) NEAR FIELD COMMUNICATION DEVICE

(71) Applicant: SAMSUNG ELECTRONICS CO., LTD., Suwon-si, Gyeonggi-Do (KR)

(72) Inventors: Junho Kim, Yongin-si (KR); Seok-Hyun Kim, Hwaseong-si (KR); Jaehun Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/626,252

(22) Filed: Jun. 19, 2017

(65) Prior Publication Data
US 2018/0138947 A1 May 17, 2018

(30) Foreign Application Priority Data

Nov. 14, 2016 (KR) .......................... 10-2016-0151424

(51) Int. Cl.
H04B 5/00 (2006.01)
H04W 4/80 (2018.01)
H03G 3/30 (2006.01)

(52) U.S. Cl.
CPC ......... *H04B 5/0031* (2013.01); *H03G 3/3089* (2013.01); *H04B 5/0062* (2013.01); *H04W 4/80* (2018.02)

(58) Field of Classification Search
CPC .......................... H04B 5/0031; H04B 5/0062
See application file for complete search history.

(56) References Cited

U.S. PATENT DOCUMENTS

| 7,036,731 | B2 | 5/2006 | Isono et al. |
| 8,145,167 | B2 | 3/2012 | Mevel et al. |
| 8,629,763 | B2 * | 1/2014 | Hagl .................. G06K 19/0707 340/10.3 |
| 8,923,791 | B2 | 12/2014 | Muellner et al. |
| 9,106,268 | B2 | 8/2015 | Luong et al. |

(Continued)

FOREIGN PATENT DOCUMENTS

| JP | 3589092 B2 | 8/2004 |
| JP | 4407675 B2 | 11/2009 |
| JP | 4649858 B2 | 12/2010 |

(Continued)

OTHER PUBLICATIONS

"How to choose an Application specific Signal Detection Threshold for TDA523x based ASK Mode Applications," Infenion Technologies, Version 1.4, Mar. 23, 2006, pp. 1-12

(Continued)

*Primary Examiner* — Tuan H Nguyen
(74) *Attorney, Agent, or Firm* — Volentine, Whitt & Francos, PLLC

(57) ABSTRACT

A near field communication device includes an amplifier that amplifies a signal received through an antenna and outputs the signal as an amplified receive signal, a gain control block that adjusts a gain of the amplifier based on a level of a noise included in the amplified receive signal during a noise reception sequence, and a data determination block that determines a noise threshold voltage based on the level of the noise of the amplified receive signal after the gain is completely adjusted and determines data from the amplified receive signal by using the noise threshold voltage.

20 Claims, 11 Drawing Sheets

(56) References Cited

U.S. PATENT DOCUMENTS 9,184,798 B2 * 11/2015 Royston ............... H04B 5/0025
9,397,385 B2    7/2016 McFarthing

FOREIGN PATENT DOCUMENTS

| JP | 4797596 B2 | 8/2011 |
| JP | 5628116 B2 | 10/2014 |
| JP | 2016001468 A | 1/2016 |
| JP | 2016062160 A | 4/2016 |
| KR | 1020160016217 A | 2/2016 |

OTHER PUBLICATIONS

Said Sadoudi et al., "Novel Adaptive Decision Threshold Modulation Technique for UWB Direct Chaotic Communications," Journal of Engineering Science and Technology Review 8 (2) (2015) 123-129.

* cited by examiner

NEAR FIELD COMMUNICATION DEVICE

CROSS-REFERENCE TO RELATED APPLICATIONS

A claim for priority under 35 U.S.C. § 119 is made to Korean Patent Application No. 10-2016-0151424 filed Nov. 14, 2016, in the Korean Intellectual Property Office, the disclosure of which is incorporated herein in its entirety by reference.

BACKGROUND

The inventive concepts disclosed herein relate to a wireless communication device, and more particularly, to a near field communication device.

Radio frequency identification (RFID) refers to communication that enables a reader to supply power to a card located within a short range of distance from the reader and to communicate with the card. Near field communication (NFC) is an example of RFID communication. NFC provides high flexibility in that one communication device may operate as both a reader and a card.

In most cases, an NFC device is mounted in a mobile device such as a smartphone or a smart watch, thus encountering various communication environments according to an environment in which the mobile device is situated. In the case where a communication characteristic of an NFC device is fixed, the reliability and accuracy of communication with the NFC device varies with changing communication environments, thereby causing a decrease in stability of communication.

SUMMARY

Embodiments of the inventive concept provide a near field communication device that adjusts a communication characteristic based on a change of a communication environment.

Embodiments of the inventive concept provide a near field communication device including an amplifier configured to amplify a signal received through an antenna and to output the signal as an amplified receive signal; a gain control block configured to adjust a gain of the amplifier based on a level of a noise included in the amplified receive signal during a noise reception sequence; and a data determination block configured to determine a noise threshold voltage based on the level of the noise included in the amplified receive signal after the gain is completely adjusted and to determine whether the amplified receive signal includes data by using the noise threshold voltage.

Embodiments of the inventive concept further provide a near field communication device including an amplifier configured to amplify a signal received through an antenna and to output the signal as an amplified receive signal; a gain control block configured to adjust a gain of the amplifier based on a result of comparing the amplified receive signal with a first reference voltage during a noise reception sequence, and to adjust the gain of the amplifier based on a result of comparing the amplified receive signal with a second reference voltage during a signal reception sequence; and a data determination block configured to determine data by comparing the amplified receive signal with a third reference voltage during the signal reception sequence and adjusts the third reference voltage based on a level of the amplified receive signal.

Embodiments of the inventive concept further provide a near field communication device including an amplifier configured to amplify a signal received through an antenna and to output the signal as an amplified receive signal; a gain control block configured to adjust a gain of the amplifier based on a level of a noise included in the amplified receive signal during a noise reception sequence; and a data determination block configured to determine a noise threshold voltage based on the level of the noise of the amplified receive signal, to determine whether the amplified receive signal includes a signal reception sequence using the noise threshold voltage, to determine data by comparing the amplified receive signal with a data threshold during the signal reception sequence, and to adjust the data threshold based on a level of the amplified receive signal.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Below, embodiments of the inventive concept will be described with reference to the accompanying drawings to such an extent that one of ordinary skill in the art may implement embodiments of the inventive concept.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
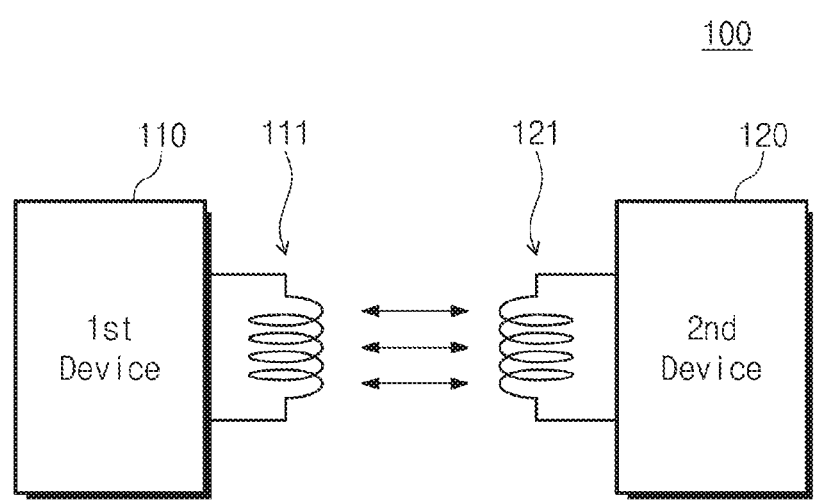
FIG. 1 illustrates an example of a near field communication (NFC) system.

FIG. 1 illustrates an example of a near field communication (NFC) system 100. Referring to FIG. 1, the NFC system 100 includes first and second NFC devices 110 and 120. The first NFC device 110 is connected with a first antenna 111, and the second NFC device 120 is connected with a second antenna 121.

Each of the first and second NFC devices 110 and 120 may operate in a reader mode or a card mode. For example, the first NFC device 110 may operate in the reader mode, and the second NFC device 120 may operate in the card mode. The first NFC device 110 operable in the reader mode may transmit a first signal to the second NFC device 120 through electromagnetic induction between the first antenna 111 and the second antenna 121. The first signal may include a continuous wave for transmitting power and a first information signal added to the continuous wave for transmitting information.

The second NFC device 120 operable in the card mode may obtain power from the continuous wave of the first signal. The second NFC device 120 may obtain information from the first information signal of the first signal. The second NFC device 120 may add a second information signal for transmitting information to the continuous wave associated with the first signal, and may transmit the added result to the first NFC device 110. For example, the second NFC device 120 may transmit a second signal to the first NFC device 110 through electromagnetic induction between the first antenna 111 and the second antenna 121. Although in the embodiment described above the first NFC device 110 is operable in the reader mode and the second NFC device 120 is operable in the card mode, in other embodiments the first NFC device 110 may be operable in the card mode and the second NFC device 120 may be operable in the reader mode.

In the following, embodiments of the inventive concept will be described with reference to an information signal and noise signals, without mention of a continuous wave. However, it should be sufficiently understood to one skilled in the art that modulation using a continuous wave may be made when an NFC device operable in a card mode or a reader mode sends an information signal, and demodulation using the continuous wave may be made upon receiving the information signal.

Figure 2:
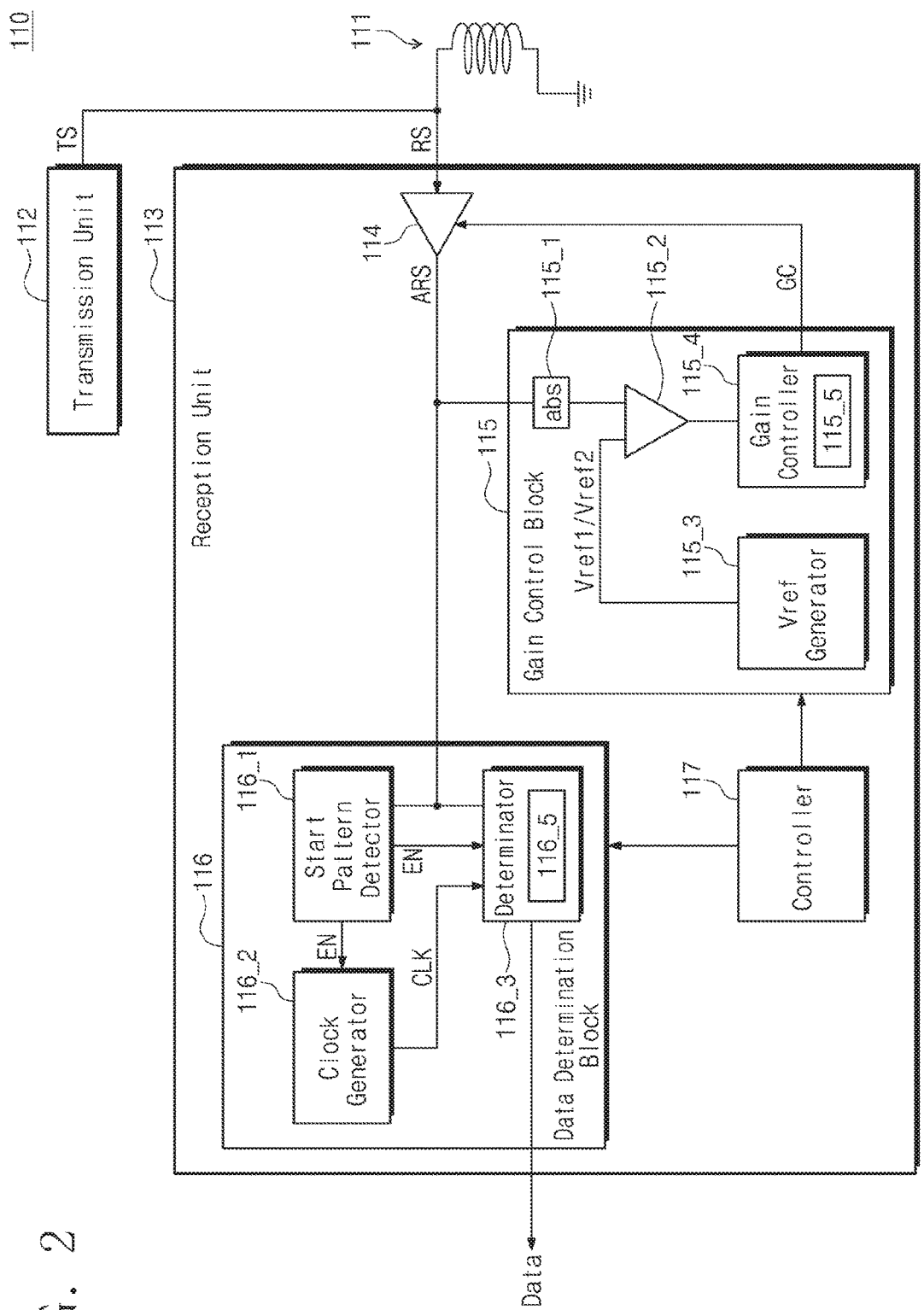
FIG. 2 illustrates a block diagram of an NFC device, according to an embodiment of the inventive concept.

FIG. 2 illustrates a block diagram of the first NFC device 110, according to an embodiment of the inventive concept. In the description of the embodiment that follows, it is assumed that the first NFC device 110 operates in the reader mode. Referring to FIG. 2, the first NFC device 110 includes the antenna 111, a transmission unit 112, and a reception unit 113.

One end of the antenna 111 is connected to the transmission unit 112 and the reception unit 113, and the other end of the antenna 111 is connected to a ground node to which a ground voltage is supplied. For example, the one end of the antenna 111 may be directly connected to the transmission unit 112 and the reception unit 113, or the one end may be connected to the transmission unit 112 and the reception unit 113 through a device such as a directional coupler which distributes a signal.

The transmission unit 112 may transmit a transmit signal TS through the antenna 111. The reception unit 113 may receive a receive signal RS through the antenna 111. The reception unit 113 includes an amplifier 114, a gain control block 115, a data determination block 116, and a controller 117.

The amplifier 114 may amplify the receive signal RS and output an amplified receive signal ARS. The gain control block 115 may control a gain of the amplifier 114 based on a level of the amplified receive signal ARS. For example, the gain control block 115 may adjust the gain of the amplifier 114 using different schemes based on whether the amplified receive signal ARS (or the receive signal RS) belongs to any one of a noise reception sequence and a signal reception sequence. The noise reception sequence includes a time interval in which an information signal is not included in the receive signal RS and only a noise signal is included therein. The signal reception sequence includes a time interval in which an information signal and a noise signal are included in the receive signal RS.

The gain control block 115 includes an absolute value extractor (abs) 115_1, a comparator 115_2, a reference voltage generator 115_3, and a gain controller 115_4. The absolute value extractor 115_1 extracts and outputs an absolute value of the amplified receive signal ARS. For example, the absolute value extractor 115_1 may include a rectifier element such as a zener diode.

The comparator 115_2 compares a first reference voltage Vref1 or a second reference voltage Vref2 provided from the reference voltage generator 115_3 with an output of the absolute value extractor 115_1. The comparison result of the comparator 115_2 is transferred to the gain controller 115_4.

The reference voltage generator 115_3 generates the first and second reference voltages Vref1 and Vref2 under control of the controller 117. For example, during the noise reception sequence, the reference voltage generator 115_3 outputs the first reference voltage Vref1. During the signal reception sequence, the reference voltage generator 115_3 outputs the second reference voltage Vref2.

The gain controller 115_4 controls the gain of the amplifier 114 based on the comparison result of the comparator 115_2. For example, when the amplified receive signal ARS (e.g., the absolute value of a voltage (or an amplitude) of the amplified receive signal ARS) is not smaller than the first reference voltage Vref1 or the second reference voltage Vref2, the gain controller 115_4 may decrease the gain of the amplifier 114. For example, in the case where the amplified receive signal ARS is smaller than the first reference voltage Vref1 or the second reference voltage Vref2, the gain controller 115_4 may maintain the gain of the amplifier 114.

The gain controller 115_4 includes a register 115_5. The register 115_5 may store a default (or initial) value and an adjusted current value of the gain of the amplifier 114. When there is a need to reset the gain of the amplifier 114, the gain controller 115_4 may reset the gain of the amplifier 114 to an initial value stored in the register 115_5.

The data determination block 116 determines data from the amplified receive signal ARS. For example, the data determination block 116 may compare the amplified receive signal ARS with a third reference voltage Vref3 (see FIG. 8) and may determine data based on the comparison result. The data determination block 116 may adjust a level of the third reference voltage Vref3, which is a reference for determining data, based on a level of the amplified receive signal ARS or a level change of the amplified receive signal ARS.

The data determination block 116 includes a start pattern detector 116_1, a clock generator 116_2, and a determinator 116_3. The start pattern detector 116_1 determines whether a start pattern is included in the amplified receive signal ARS. For example, a start pattern may be a pattern that has a signal level higher than a noise threshold (i.e., noise threshold voltage) and that has a waveform defined by an NFC standard. For example, the noise threshold may be a reference for determining whether the amplified receive signal ARS includes only a noise signal, or includes both a noise signal and an information signal. The noise threshold may be set by the start pattern detector 116_1 by adding a margin (or a weight) of 10% to the first reference voltage Vref1. If the start pattern is detected, the start pattern detector 116_1 transfers an enable signal EN to the clock generator 116_2 and the determinator 116_3.

The clock generator 116_2 outputs a clock signal CLK in response to the enable signal EN. The clock signal CLK may have the same frequency as a frequency of an information signal that is defined by the NFC standard.

The determinator 116_3 performs a convolution operation on the clock signal CLK and the amplified receive signal ARS in response to the enable signal EN. The determinator 116_3 may compare the result of the convolution operation and the third reference voltage Vref3, and may determine data based on the comparison result. The determinator 116_3 includes a calculation block 116_5. The calculation block 116_5 may adjust a level of the third reference voltage Vref3 based on a level of the amplified receive signal ARS, for example based on a level or a level change of a convolution signal CS (see FIG. 8) which is the result of the convolution operation. The third reference voltage Vref3, which is a reference for determining data, may be referred to as a "data threshold".

The controller 117 controls the gain control block 115 and the data determination block 116. For example, the controller 117 may allow the gain control block 115 and the data determination block 116 to operate, based on timings that are defined by the NFC standard.

According to an embodiment of the inventive concept, the gain of the amplifier 114 may be adaptively adjusted according to a level of the amplified receive signal ARS, for example according to a level of a noise signal in the noise reception sequence and according to levels of noise and receive signals in the signal reception sequence. Also, the third reference voltage Vref3 that is a data threshold may be adaptively adjusted according to a level of the amplified receive signal ARS or a level change of the amplified receive signal ARS. Accordingly, even though a communication environment may change, that is even though the amplified receive signal ARS may change, the first NFC device 110 may adjust the gain and the data threshold of the amplifier 114 adaptively so as to cope with the change, thus maintaining the quality of communication. The first NFC device 110 may thus provide improved reliability and stability.

In FIG. 2, the gain control block 115 is described as including the absolute value extractor 115_1. However, in other embodiments a comparator may be further used instead of the absolute value extractor 115_1. For example, the gain control block 115 may be changed such that a first comparator compares the amplified receive signal ARS and a positive reference voltage (having a value of the first reference voltage Vref1 or the second reference voltage Vref2), and a second comparator compares the amplified receive signal ARS and a negative reference voltage (having a value of the first reference voltage Vref1 or the second reference voltage Vref2). When one of the first and second comparators determine that the amplified received signal ARS is greater than the positive reference voltage or smaller than the negative voltage, the gain controller 115_4 may adjust the gain of the amplifier 114.

Figure 3:
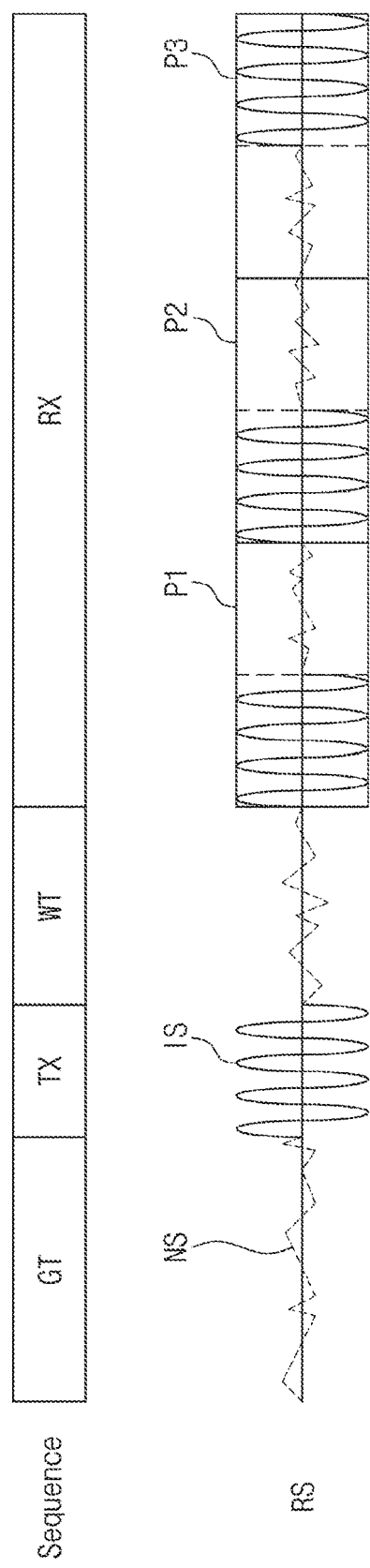
FIG. 3 illustrates an example of communication sequences by which an NFC device communicates.

FIG. 3 illustrates an example of communication sequences by which the first NFC device 110 communicates. Referring to FIGS. 2 and 3, communication sequences of the first NFC device 110 include a guard time sequence GT, a transmission sequence TX, a waiting time sequence WT, and a reception sequence RX.

In the guard time sequence GT, the transmission unit 112 may send a continuous wave (not shown) through the antenna 111. In this case, the transmission unit 112 may not send an information signal. In the guard time sequence GT, an information signal may not be received by the reception unit 113, and a noise signal NS may be received by the reception unit 113.

In the transmission sequence TX, the transmission unit 112 may send information signal IS through the antenna 111. The information signal IS that the transmission unit 112 sends to another NFC device (e.g., the second NFC device 120 shown in FIG. 1) may be transferred to the reception unit 113 of the another NFC device after being mixed with the noise signal NS. To avoid drawing complexity, a component of the noise signal NS is omitted in the transmission sequence TX.

In the waiting time sequence WT, the first NFC device 110 may wait for a response from the another NFC device. A length of the waiting time sequence WT may be determined by the NFC standard. If a response is received from the second NFC device 120 during a time defined by the standard, the response may be considered valid and the first NFC device 110 enters the reception sequence RX. In an embodiment, the reception sequence RX may be an interval in which an information signal is received from the second NFC device 120 when a valid response is received. During the waiting time sequence WT, the noise signal NS may be received by the reception unit 113. In the reception sequence RX after the valid response is successful, first to third patterns P1 to P3 may be received.

In an embodiment, information signals that are received in the reception sequence RX may be patterns that are determined according to NFC type-A signaling technology. However, other embodiments of the inventive concept may not be limited to the NFC Type-A signaling technology (which may hereinafter be referred to as Type-A).

Each data pattern of the Type-A includes two intervals. One of the two intervals may be a signal interval that includes an information signal, and the other thereof may be a mute interval that does not include an information signal. Data patterns may indicate data based on whether the signal interval gets ahead of (or precedes) the mute interval, or the mute interval gets ahead of (or precedes) the signal interval.

The first pattern P1 may be a start pattern of the Type-A. The start pattern of the Type-A is set such that the signal interval gets ahead of the mute interval. Each of the second and third patterns P2 and P3 or other patterns following the second and third patterns P2 and P3 may have the signal interval and the mute interval having an order based on data.

In the signal intervals of the first to third patterns P1 to P3, the information signal IS and the noise signal NS may be received by the reception unit 113 while they are mixed. To avoid drawing complexity, in FIG. 3 a component of the noise signal NS is omitted in the signal intervals. In the mute intervals of the first to third patterns P1 to P3, the noise signal NS may be received by the reception unit 113.

Figure 4:
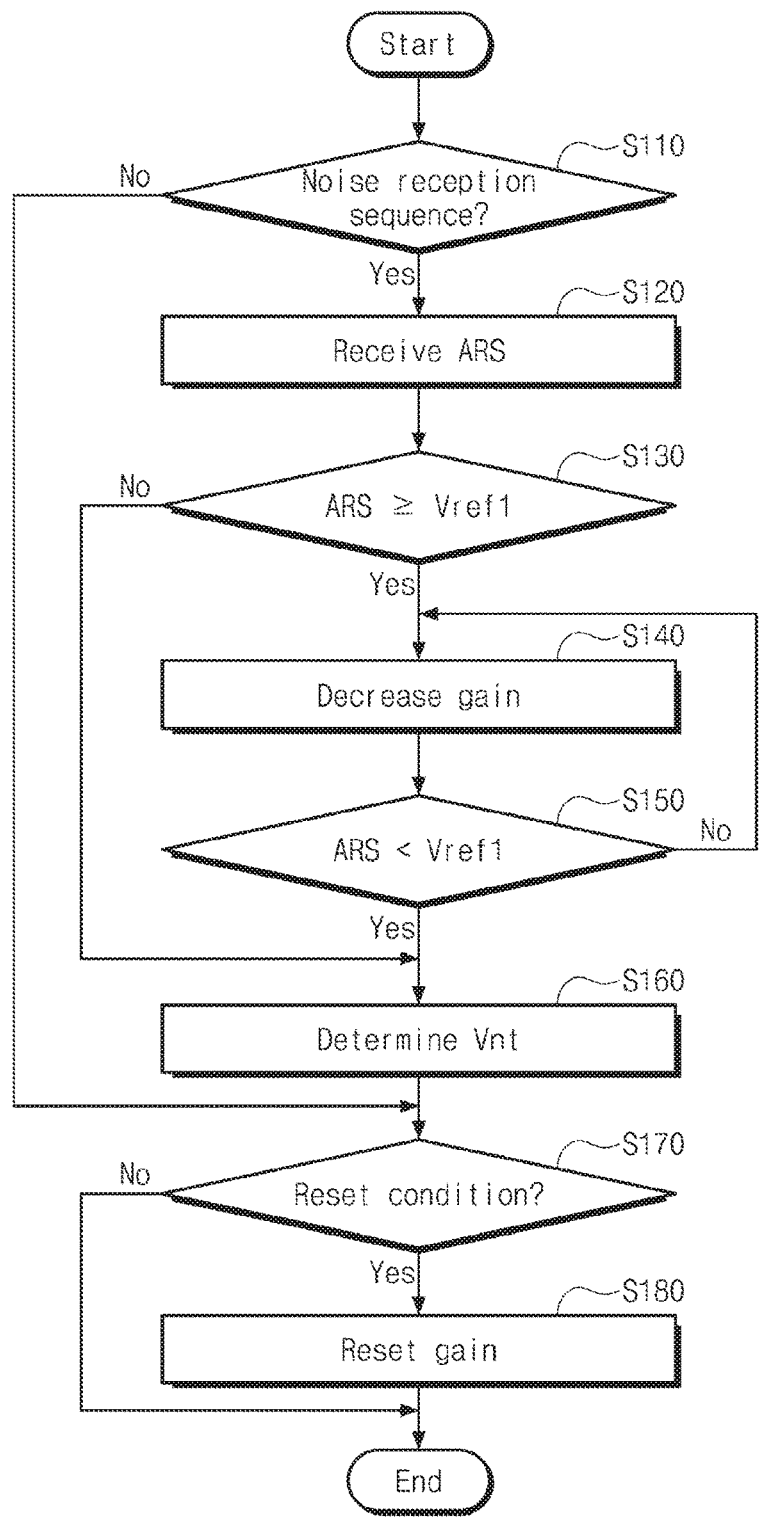
FIG. 4 illustrates a flowchart of an operating method of the NFC device, according to an embodiment of the inventive concept.

FIG. 4 illustrates a flowchart of an operating method of the first NFC device 110, according to an embodiment of the inventive concept. Referring to FIGS. 2 to 4, in operation S110, the reception unit 113 determines whether a current sequence is a noise reception sequence. For example, at least one of the guard time sequence GT and the waiting time sequence WT may be determined as a noise reception sequence. If the current sequence is a noise reception sequence, the process proceeds to operation S120. If the current sequence is not a noise reception sequence, the process proceeds to operation S170.

In operation S120, the gain control block 115 receives the amplified receive signal ARS. In operation S130, the gain control block 115 determines whether a level of the amplified receive signal ARS is not smaller than the first reference voltage Vref1. For example, the first reference voltage Vref1 may be a reference for determining a noise threshold and may be lower than the third reference voltage Vref3 which is a data threshold. If the level of the amplified receive signal ARS is not smaller than the first reference voltage Vref1, the process proceeds to operation S140. If the level of the amplified receive signal ARS is smaller than the first reference voltage Vref1, the process proceeds to operation S160.

In operation S140, the gain control block 115 decreases a gain of the amplifier 114. That is, if an amplified level of the noise signal NS received in the noise reception sequence is not smaller than the first reference voltage Vref1, the gain control block 115 may suppress the noise signal NS by reducing a gain of the amplifier 114.

In operation S150, the gain control block 115 determines whether a level of the amplified receive signal ARS is smaller than the first reference voltage Vref1. If the level of the amplified receive signal ARS is smaller than the first reference voltage Vref1, the process proceeds to operation S160. If the level of the amplified receive signal ARS is not smaller than the first reference voltage Vref1, operation S140 is iteratively performed until the level of the amplified receive signal ARS is smaller than the first reference voltage Vref1, and thus, the gain of the amplifier 114 may decrease more and more.

In operation S160, the data determination block 116 determines a noise threshold voltage Vnt corresponding to the noise threshold. For example, the data determination block 116 (e.g., start pattern detector 116_1) may determine a value, which is obtained by adding a preset margin value to a level of the amplified receive signal ARS, as the noise threshold voltage Vnt. As should be understood as shown in FIG. 4, the noise threshold voltage Vnt is determined in step S160 after the gain is decreased (i.e., completely adjusted) in step S140.

In operation S170, the reception unit 113 determines whether a reset condition is satisfied. For example, the reception unit 113 may determine that the reset condition is satisfied, periodically, for example, when a predetermined time elapses. The reception unit 113 may determine that the reset condition is satisfied, when communication with the second NFC device 120 is completed a predetermined number of times. The reception unit 113 may determine that the reset condition is satisfied, when communication with the second NFC device 120 is not successful. The reception unit 113 may determine that the reset condition is satisfied, when a reset operation is requested by the external controller 117. If the reset condition is satisfied, in operation S180, the gain control block 115 may reset the gain of the amplifier 114 to the initial value stored in the register 115_5. If the reset condition is not satisfied, the gain of the amplifier 114 is maintained.

Figure 5:
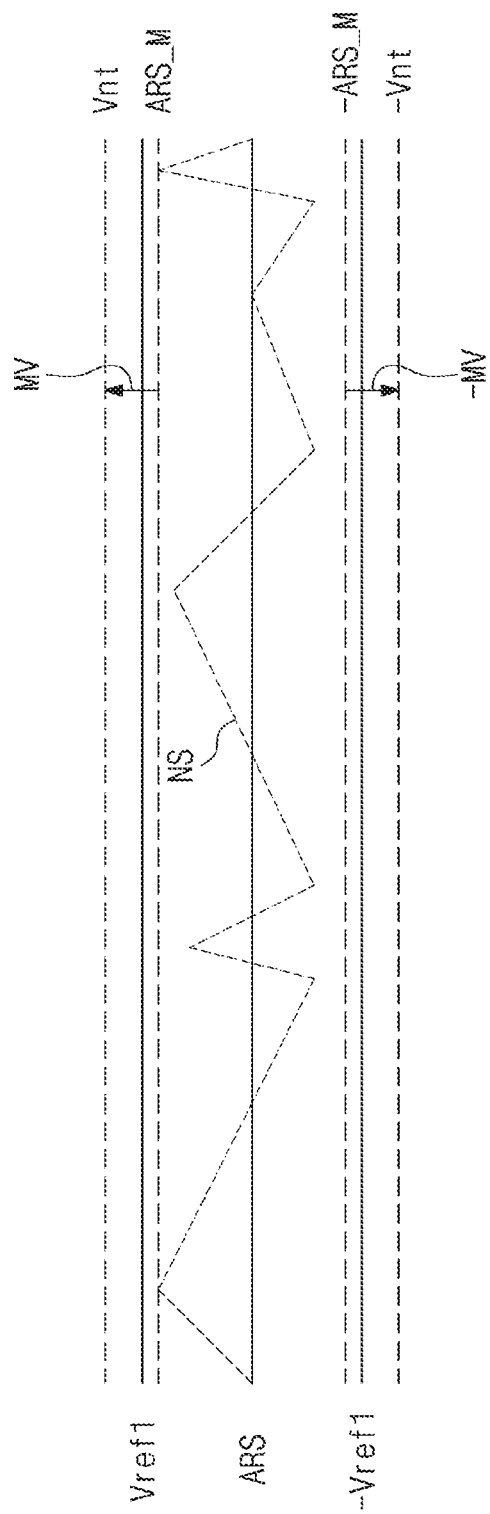
FIG. 5 illustrates an example in which an amplified receive signal is suppressed by a gain control block.

FIG. 5 illustrates an example in which the amplified receive signal ARS is suppressed by the gain control block 115. In this embodiment, an example in which the noise signal NS of the guard time sequence GT is suppressed is described with respect to FIG. 5. Referring to FIGS. 4 and 5, a level of the noise signal NS, for example, an absolute level is suppressed to the first reference voltage Vref1 or smaller. A level (for example, an absolute level) of the noise threshold voltage Vnt that corresponds to a noise threshold used in the data determination block 116 may be set based on a level (for example, an absolute level) of the amplified receive signal ARS. A level of the noise threshold voltage Vnt may be determined by adding a margin value MV (or a weight) to a level of the amplified receive signal ARS. For example, a level of the noise threshold voltage Vnt may be set to 110% of the level of the amplified receive signal ARS. In an embodiment, a level of the noise threshold voltage Vnt is illustrated as being determined based on the maximum level ARS_M of the amplified receive signal ARS. However, in other embodiments a level of the noise threshold voltage Vnt may be determined based on one of various values such as an average value and an intermediate value of the amplified receive signal ARS.

According to an embodiment of the inventive concept, a level of the noise signal NS is controlled by the gain control block 115 to be smaller than the first reference voltage Vref1. The data determination block 116 determines whether only the noise signal NS is present in the amplified receive signal ARS (refer to FIG. 2) or the noise signal NS and the information signal IS are mixed therein, based on the noise threshold voltage Vnt that is determined according to a level of the amplified receive signal ARS suppressed to be smaller than the first reference voltage Vref1. Accordingly, even though a level (e.g., an average or maximum level) of the noise signal NS may change with changes in the environment in which the NFC system operates, it may be possible to prevent the data determination block 115 from abnormally determining the amplified receive signal ARS including only the noise signal NS as also including the information signal IS.

Figure 6:
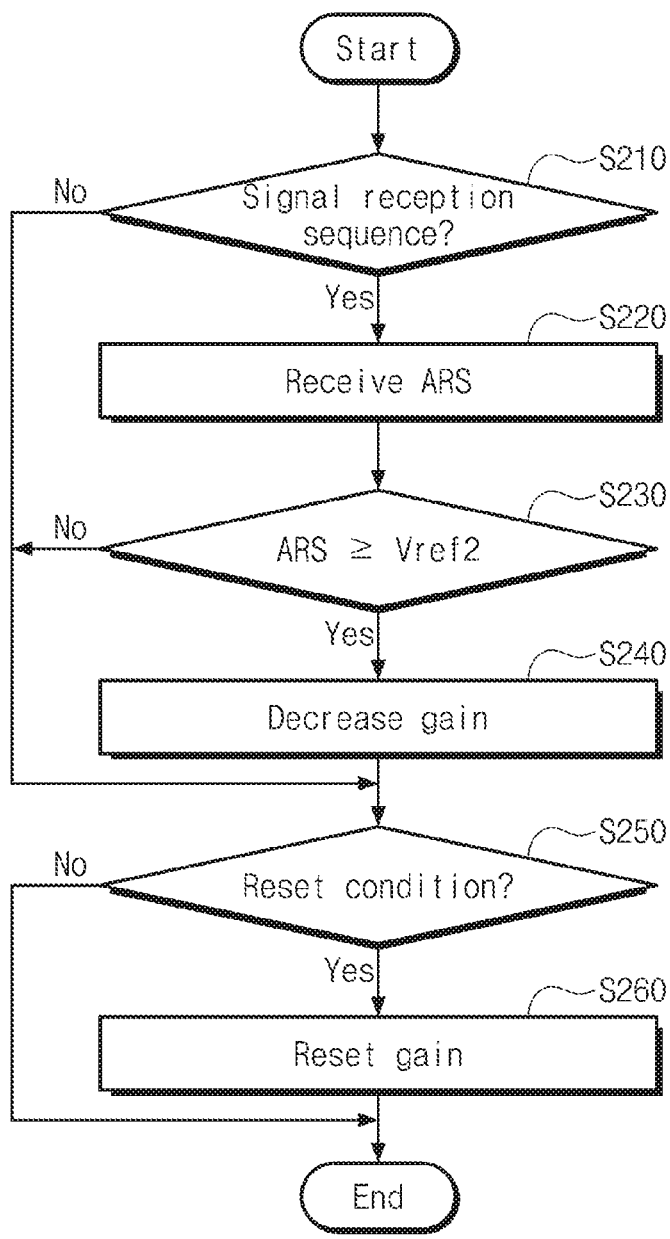
FIG. 6 illustrates a flowchart of an operating method of the NFC device, according to another embodiment of the inventive concept.

FIG. 6 illustrates a flowchart of an operating method of the first NFC device 110, according to another embodiment of the inventive concept. Referring to FIGS. 2, 3, and 6, in operation S210, the reception unit 113 determines whether a current sequence is a signal reception sequence. For example, the reception sequence RX may be determined as the signal reception sequence. If the current sequence is the signal reception sequence, the process proceeds to operation S220. If the current sequence is not the signal reception sequence, the process proceeds to operation S250.

In operation S220, the gain control block 115 receives the amplified receive signal ARS. In operation S230, the gain control block 115 determines whether a level of the amplified receive signal ARS is not smaller than the second reference voltage Vref2. For example, the second reference voltage Vref2 may be a reference for determining whether the amplifier 114 is saturated and may be larger than the third reference voltage Vref3 which is a data threshold. The second reference voltage Vref2 may be lower than a saturation voltage Vsat (refer to FIG. 7) of the amplifier 114. If the level of the amplified receive signal ARS is not smaller than the second reference voltage Vref2, the process proceeds to operation S240. If the level of the amplified receive signal ARS is smaller than the second reference voltage Vref2, the process proceeds to operation S250.

In operation S240, the gain control block 115 decreases a gain of the amplifier 114. That is, if an amplified level of the noise signal NS and the information signal IS received in the signal reception sequence is not smaller than the second reference voltage Vref2, the gain control block 115 decreases the gain of the amplifier 114, and thus, the amplifier 114 may be prevented from being saturated.

In operation S250, the reception unit 113 determines whether a reset condition is satisfied. For example, the reception unit 113 may determine that the reset condition is satisfied, periodically, for example, when a predetermined time elapses. The reception unit 113 may determine that the reset condition is satisfied, when communication with the second NFC device 120 is completed a predetermined number of times. The reception unit 113 may determine that the reset condition is satisfied, when communication with the second NFC device 120 is not successful. The reception unit 113 may determine that the reset condition is satisfied, when a reset operation is requested by the external controller 117. If the reset condition is satisfied, in operation S260, the gain control block 115 resets the gain of the amplifier 114 to the initial value stored in the register 115_5. If the reset condition is not satisfied, the gain of the amplifier 114 is maintained.

Figure 7:
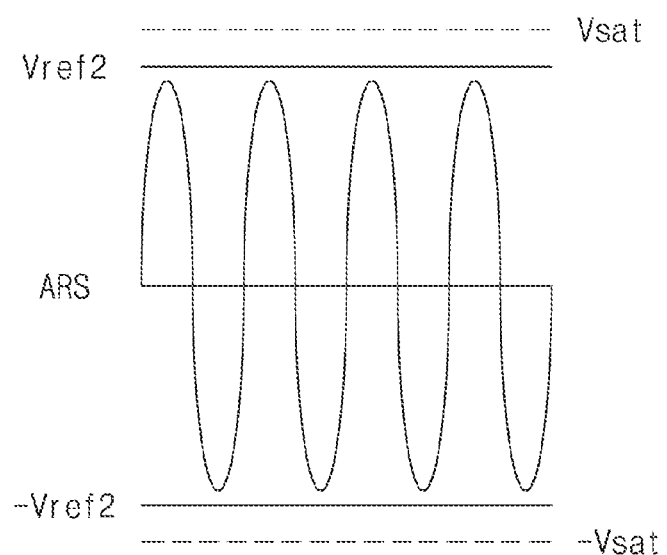
FIG. 7 illustrates another example in which an amplified receive signal is suppressed by the gain control block.

FIG. 7 illustrates another example in which the amplified receive signal ARS is suppressed by the gain control block 115. Referring to FIGS. 6 and 7, a level of the amplified receive signal ARS (e.g., an absolute level of the amplified receive signal ARS) is suppressed to the second reference voltage Vref2 or smaller. The second reference voltage Vref2 is set to be smaller in level than a saturation voltage Vsat of the amplifier 114. For example, the second reference voltage Vref2 may be set to 90% of the saturation voltage Vsat.

According to an embodiment of the inventive concept, a level of the amplified receive signal ARS including the noise signal NS and the information signal IS is controlled by the gain control block 115 to be smaller than the second reference voltage Vref2. The second reference voltage Vref2 is set to be smaller in level than the saturation voltage Vsat of the amplifier 114. Accordingly, even though a level (e.g., an average or maximum level) of the noise signal NS or the information signal IS may change with changes in the environment in which the NFC system operates, the amplifier 114 may be prevented from being saturated.

Figure 8:
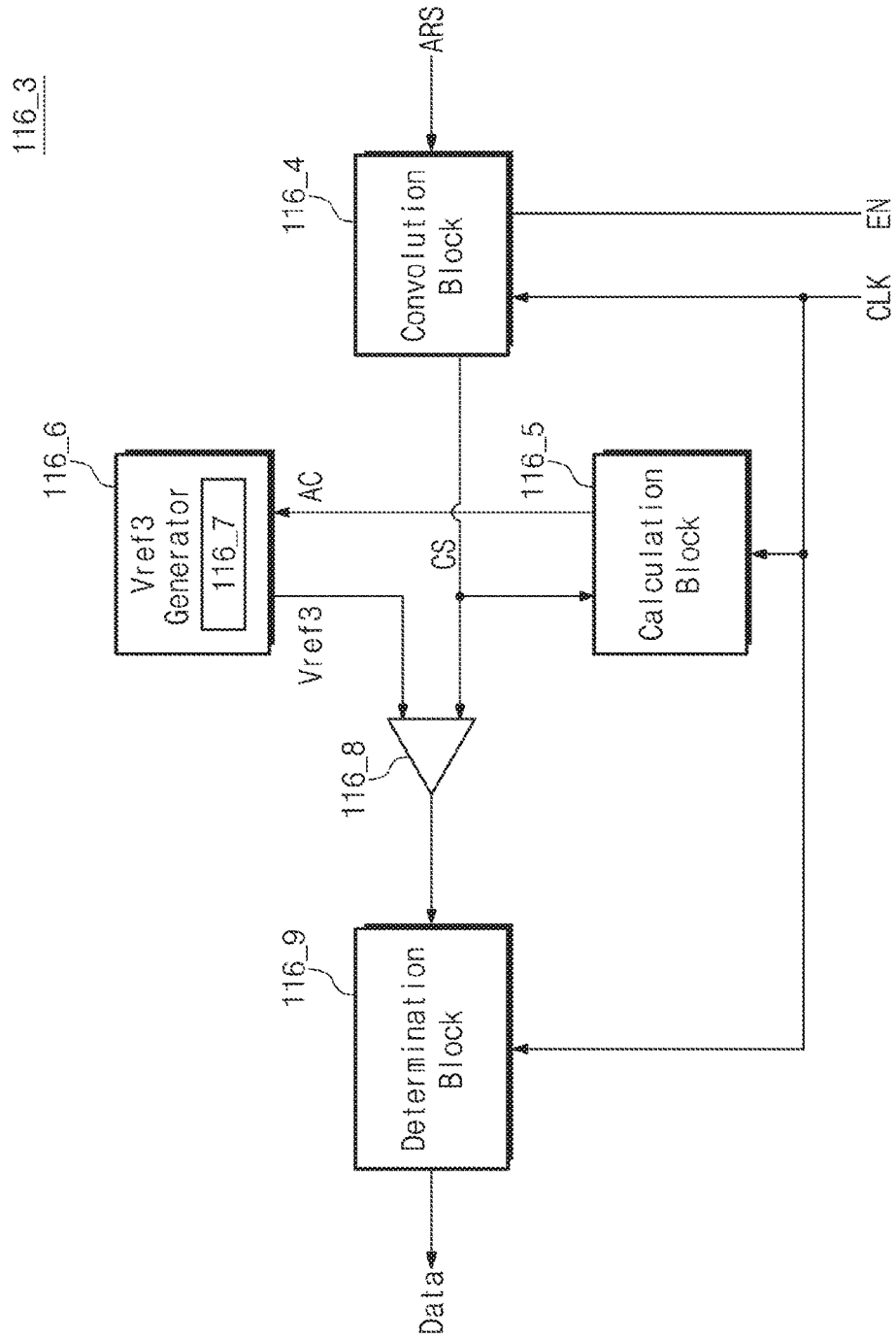
FIG. 8 illustrates a block diagram of a determinator, according to an embodiment of the inventive concept.

FIG. 8 illustrates a block diagram of an example of the determinator 116_3, according to an embodiment of the inventive concept. Referring to FIGS. 2 and 8, the determinator 116_3 includes a convolution block 116_4, a calculation block 116_5, a third reference voltage (Vref3) generator 116_6, a comparator 116_8, and a determination block 116_9.

When the start pattern detector 116_1 activates the enable signal EN, the convolution block 116_4 may receive the amplified receive signal ARS and the clock signal CLK. The convolution block 116_4 performs a convolution operation on the amplified receive signal ARS by using the clock signal CLK. The convolution block 116_4 outputs the result of the convolution operation as a convolution signal CS.

The calculation block 116_5 receives the convolution signal CS and the clock signal CLK. The calculation block 116_5 determines whether an interval of a current convolution signal CS is a signal interval or a mute interval based on the clock signal CLK. The calculation block 116_5 generates an adjustment code AC for adjusting the third reference voltage Vref3 based on a level of the convolution signal CS or a level change thereof. That is, the third reference voltage (Vref3) generator 116_6 is controlled to adjust the generated third reference voltage Vref3 based on the adjustment code AC. For example, the calculation block 116_5 may calculate an intermediate value of a level of the mute interval and a level of the signal interval for each pattern of the convolution signal CS. When a plurality of patterns are received as the convolution signal CS, the calculation block 116_5 may calculate an accumulated average of intermediate values of the plurality of patterns. The calculation block 116_5 may generate the adjustment code AC such that the third reference voltage Vref3 is adjusted by the third reference voltage (Vref3) generator 116_6 to a level of the accumulated average or a level obtained by adding a weight (or margin) to the accumulated average. As another embodiment, the calculation block 116_5 may generate the adjustment code AC such that the third reference voltage Vref3 is adjusted by the third reference voltage (Vref3) generator 116_6 to a level obtained by adding a weight (or margin) to the maximum value or the maximum value among the intermediate values of the plurality of patterns.

The third reference voltage generator 116_6 may include a register 116_7. The register 116_7 stores an initial value of the third reference voltage Vref3 or information about an adjusted value. Initially, the third reference voltage generator 116_6 may generate the third reference voltage Vref3 based on the initial value stored in the register 116_7. If the adjustment code AC is received from the calculation block 116_5, the third reference voltage generator 116_6 may store a value adjusted by the adjustment code AC in the register 116_7 and may generate the third reference voltage Vref3 based on the adjusted value. If a reset condition is satisfied, the third reference voltage generator 116_6 may delete the adjusted value stored in the register 116_7 and may output the third reference voltage Vref3 based on the initial value.

The comparator 116_8 receives the convolution signal CS and the third reference voltage Vref3. The comparator 116_8 outputs a result of comparing the convolution signal CS and the third reference voltage Vref3 to the determination block 116_9.

The determination block 116_9 determines data based on the comparison result of the comparator 116_8.

Figure 9:
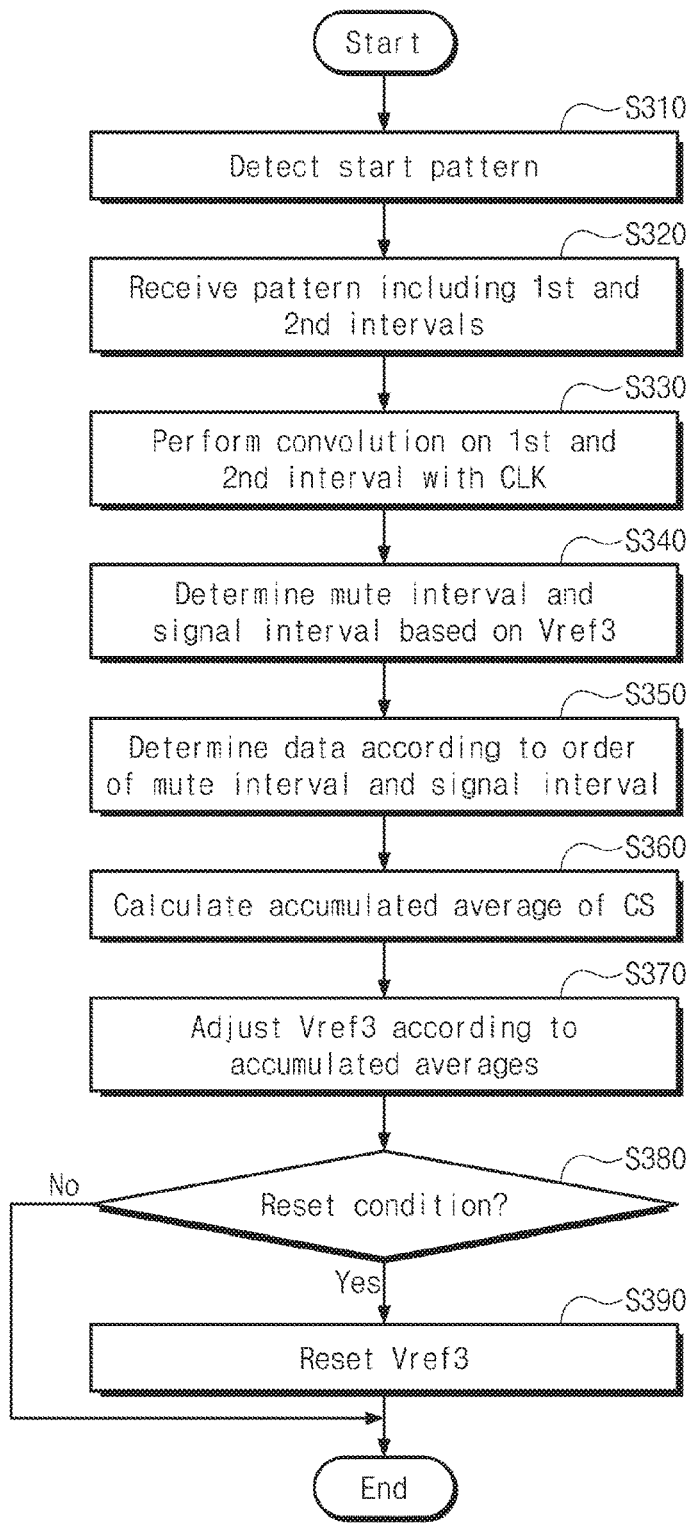
FIG. 9 illustrates a flowchart of an operating method of the NFC device, according to another embodiment of the inventive concept.

FIG. 9 illustrates a flowchart of an operating method of the first NFC device 110, according to another embodiment of the inventive concept. Referring to FIGS. 2, 8, and 9, in step S310, the start pattern detector 116_1 detects a start pattern from the amplified receive signal ARS. The start pattern detector 116_1 consequently activates the enable signal EN responsive to detection of the start pattern. In embodiments, the start pattern detector 116_1 may use the aforementioned noise threshold to determine whether a start pattern is included in the amplified receive signal ARS.

In operation S320, the determinator 116_3 receives a pattern including first and second intervals. In operation S330, the convolution block 116_4 performs a convolution operation on the first and second intervals by using the clock signal CLK. In operation S340, the comparator 116_8 and the determination block 116_9 determine the mute interval and the signal interval based on the third reference voltage Vref3. In operation S350, the determination block 116_9 determines data based on an order of the mute interval and the signal interval.

In operation S360, the calculation block 116_5 calculates an accumulated average (or the maximum value) of intermediate values of patterns of the convolution signal CS. In operation S370, the calculation block 116_5 generates an adjustment code AC based on the accumulated average (or the maximum value), and the third reference voltage (Vref3) generator 116_6 adjusts the third reference voltage Vref3 based on the adjustment code AC.

In operation S380, the reception unit 113 determines whether a reset condition of the third reference voltage Vref3 is satisfied. For example, the reception unit 113 may determine that the reset condition is satisfied, periodically, for example, when a predetermined time elapses. The reception unit 113 may determine that the reset condition is satisfied, when communication with the second NFC device 120 is completed a predetermined number of times. The reception unit 113 may determine that the reset condition is satisfied, when communication with the second NFC device 120 is not successful. The reception unit 113 may determine that the reset condition is satisfied, when a reset operation is requested by the external controller 117. If the reset condition is satisfied, in operation S390, the third reference voltage generator 116_6 resets a level of the third reference voltage Vref3 to the initial value stored in the register 116_7. If the reset condition is not satisfied, the third reference voltage Vref3 is maintained.

Figure 10:
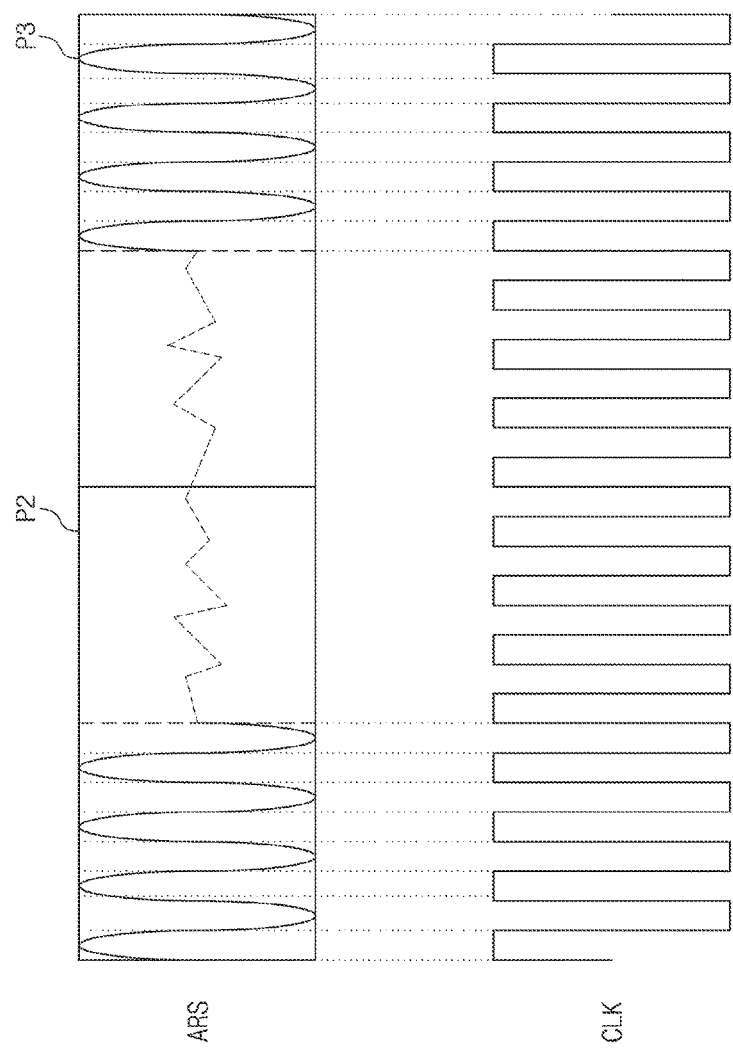
FIG. 10 illustrates an example in which a convolution operation is performed, according to an embodiment of the inventive concept.

FIG. 10 illustrates an example in which a convolution operation is performed, according to an embodiment of the inventive concept. In this embodiment, an example of a convolution operation performed on the second and third patterns P2 and P3 of the receive signal RS (or amplified receive signal ARS) as shown in FIG. 3 is described with respect to FIG. 10. Referring to FIGS. 8 and 10, a frequency of the information signal IS is the same as a frequency of the clock signal CLK and a phase of the information signal IS agrees with a phase of the clock signal CLK. Accordingly, if the convolution operation is performed on the second and third patterns P2 and P3 by using the clock signal CLK, the information signals IS of the signal interval are amplified, and the noise signals NS of the mute interval are not amplified. A waveform of the convolution signal CS generated based on the clock signal CLK and the receive signal RS may correspond to waveforms of the second and third patterns P2 and P3 of FIG. 10, in which the amplitude of the information signals IS of the signal intervals are amplified, and thus the waveform of the convolution signal CS is not illustrated separately.

In an embodiment, the third reference voltage Vref3 used as a data threshold is defined between a level of the signal interval of the convolution signal CS and a level of the mute interval thereof. If the third reference voltage Vref3 is set to an intermediate value of the signal interval and the mute interval, data may be accurately determined. In this case, the comparator 116_8 may output a constant voltage in the mute interval and may output a signal, which has the same frequency and phase of the clock signal CLK, in the signal interval.

If a communication environment changes, a level of the signal interval and a level of the mute interval may change. For example, if the first NFC device 110 enters an environment in which noise is strong, a level of the mute interval may increase. As a further example, if a communication obstacle is located between the first NFC device 110 and the second NFC device 120 or a distance between the devices 110 and 120 increases, a level of the signal interval may decrease.

According to an embodiment of the inventive concept, the first NFC device 110 may adjust the third reference voltage Vref3 as the data threshold so as to track a level change of the signal interval and a level change of the mute interval, in more detail, a change in an intermediate value of the signal interval and the mute interval. For example, if an accumulated average (or the maximum value) of the intermediate value of the mute interval and the level change of the signal interval increase, a level of the third reference voltage Vref3 increases. If the accumulated average (or the maximum value) of the intermediate value of the mute interval and the level change of the signal interval decrease, a level of the third reference voltage Vref3 decreases. Accordingly, the reliability and stability of communication are improved.

In an embodiment, the calculation block 116_5 generates the adjustment code AC such that the calculated accumulated average (or the maximum value) is the same as the third reference voltage Vref3. The calculation block 116_5 may generate the adjustment code AC for adjusting the third reference voltage Vref3 such that the third reference voltage Vref3 has a value corresponding to 90% to 110% of the calculated accumulated average (or the maximum value).

In an embodiment, the calculation block 116_5 may calculate the accumulated average (or the maximum value) of intermediate values of patterns, a predetermined number of values of which is determined in advance. For example, the calculation block 116_5 may manage samples of intermediate values (i.e., levels) of the patterns, the number of which is determined in advance, based on a first-in first-out (FIFO) scheme and may generate the adjustment code AC based on the accumulated average (or the maximum value) thereof.

In an embodiment, the calculation block 116_5 may add a weight of 1 or less to intermediate values of previous patterns and may add a weight of 1 or more to an intermediate value of a current pattern. The calculation block 116_5 may generate the adjustment code AC by calculating an accumulated average (or the maximum value) based on the weight-added intermediate values.

In the above embodiment, functions and operations of the first NFC device 110 in the reader mode are described. However, it should be understood that the scope and spirit and embodiments of the inventive concept are identically applicable to functions and operations of the first NFC device 110 in the card mode.

Figure 11:
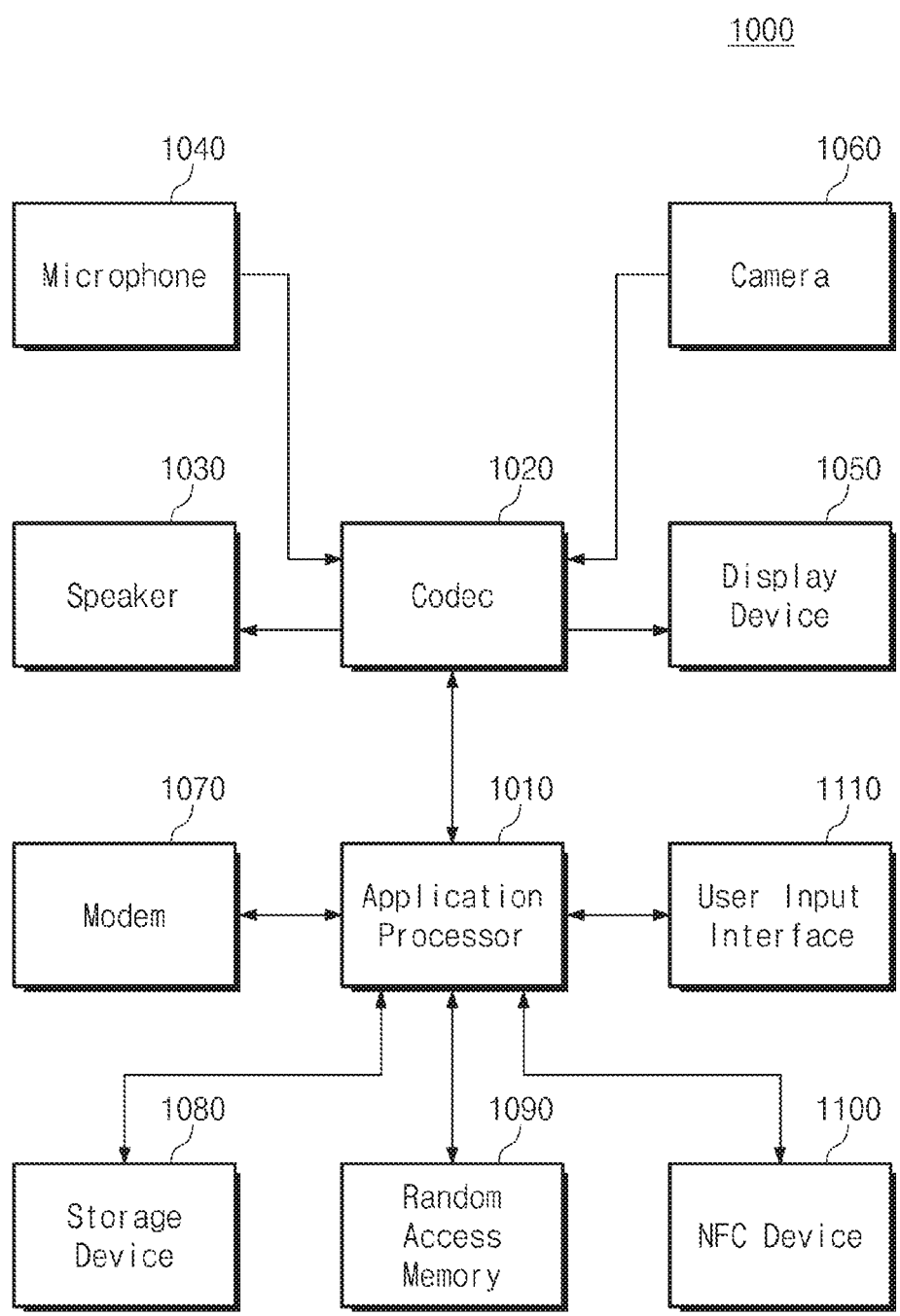
FIG. 11 illustrates a block diagram of a mobile device according to an embodiment of the inventive concept.

FIG. 11 illustrates a block diagram of a mobile device 1000, according to an embodiment of the inventive concept. Referring to FIG. 11, the mobile device 1000 includes an application processor 1010, a codec 1020, a speaker 1030, a microphone 1040, a display device 1050, a camera 1060, a modem 1070, a storage device 1080, a random access memory 1090, a NFC device 1100 and a user input interface 1110.

The application processor 1010 may drive an operating system for operating the mobile device 1000 and may drive various applications on the operating system. The codec 1020 may perform coding and decoding on a voice signal or an image signal. The codec 1020 may perform a task, which is associated with processing a voice signal or an image signal, while the task is delegated from the application processor 1010.

The speaker 1030 may play a voice signal transferred from the codec 1020. The microphone 1040 may detect a sound from the outside, may convert the detected sound into an electrical voice signal, and may output the voice signal to the codec 1020. The display device 1050 may play an image signal transferred from the codec 1020. The camera 1060 may convert a scene in a field of vision into an electrical image signal, and may output the image signal to the codec 1020.

The modem 1070 may communicate with an external device using a wired or wireless scheme. The modem 1070 may transfer data to an external device in response to a request of the application processor 1010 or may request data from the external device. The storage device 1080 may be main storage of the mobile device 1000. The storage device 1080 may be used to store data for a long period of time and may retain data stored therein even though power is removed therefrom. The random access memory 1090 may be used as a main memory of the mobile device 1000. The random access memory 1090 may be used for master devices, such as the application processor 1010, the modem 1070, the codec 1020, etc. to temporarily store data.

The NFC device 1100 may be the first NFC device 110 described with reference to FIGS. 1 to 10. The NFC device 1100 may operate as a reader or a card. The NFC device 1100 may adjust a gain of an amplifier and a level of a third reference voltage, which is used as a data threshold, based on a level of the amplified receive signal ARS. Accordingly, the reliability of communication of the NFC device 1100 may be improved, and the stability of the mobile device 1000 may be improved.

A user input interface 1110 may include various devices that receive inputs from a user. For example, the user input interface 1110 may include devices, which receive an input directly from a user, such as a touch panel, a touch screen, a button, and a key pad or devices, which indirectly receive results generated by actions of the user, such as an optical sensor, a proximity sensor, a gyroscope sensor, and a pressure sensor.

According to an embodiment of the inventive concept, it may be possible to adaptively adjust a data threshold for determining a receive amplification gain and receive data of a near field communication device. Accordingly, a near field communication device that has improved reliability and stability by adaptively coping with a change in a communication environment is provided.

Various embodiments are described with references terms of "block/blocks" and "unit/units". Each of the block/blocks and unit/units may be implemented with hardware, such as for example an integrated circuit IC, an application specific integrated circuit ASIC, a field programmable gate array FPGA, a complex programmable logic device CPLD, or the like. Each of the block/blocks and unit/units may be implemented with firmware, an application or software executed by the hardware, such as the IC, the ASIC, the FPGA, the CPLD, or the like. Each of the block/blocks and unit/units may be implemented in combination with the hardware and at least one of the firmware, the application and the software. Also, the various described embodiments may be combined with each other. For example, in embodiments of the inventive concept, an NFC device may be configured to carry out any two or more of the operating methods as described with respect to FIG. 4, FIG. 6 and FIG. 9.

While the inventive concept has been described with reference to exemplary embodiments, it should be apparent to those skilled in the art that various changes and modifications may be made without departing from the spirit and scope of the inventive concept. Therefore, it should be understood that the above embodiments are not limiting, but illustrative.

What is claimed is:

1. A near field communication device comprising:
    an amplifier configured to amplify a signal received through an antenna and to output the signal as an amplified receive signal;
    a gain control block configured to adjust a gain of the amplifier based on a level of a noise included in the amplified receive signal during a noise reception sequence; and
    a data determination block configured to determine a noise threshold voltage based on the level of the noise included in the amplified receive signal during the noise reception sequence, after the gain is completely adjusted, and to determine whether the amplified receive signal includes data by using the noise threshold voltage,
    wherein the noise reception sequence includes a time interval in which an information signal is not included in the signal received through the antenna.

2. The near field communication device of claim 1, wherein when the level of the noise is not smaller than a reference voltage, the gain control block is configured to decrease the gain of the amplifier.

3. The near field communication device of claim 2, wherein the data determination block is configured to determine the noise threshold voltage as a result obtained by adding a margin value to the level of the amplified receive signal during the noise reception sequence.

4. The near field communication device of claim 1, wherein when the level of the noise is smaller than a reference voltage, the gain control block is configured to maintain the gain of the amplifier.

5. The near field communication device of claim 1, wherein the noise reception sequence comprises at least one of a guard time sequence and a waiting time sequence.

6. The near field communication device of claim 1, wherein the gain control block is configured to reset the gain of the amplifier to an initial value periodically, when a communication failure occurs or in response to a request of an external device.

7. The near field communication device of claim 1, wherein during a signal reception sequence, the gain control block is configured to adjust the gain of the amplifier based on a signal pattern and the level of the noise of the amplified receive signal.

8. The near field communication device of claim 1, wherein when a start pattern is detected in the amplified receive signal, the data determination block is configured to determine data from the amplified receive signal by comparing the amplified receive signal with a reference voltage, and to adjust a level of the reference voltage based on a level change of the amplified receive signal.

9. The near field communication device of claim 8, wherein the data determination block is configured to determine an interval in which a level of the amplified receive signal is lower than the reference voltage as a mute interval, and an interval in which the level of the amplified receive signal is not lower than the reference voltage as a signal interval, and
    wherein the data determination block is further configured to determine the data based on a determined order of the mute interval and the signal interval in the amplified receive signal.

10. The near field communication device of claim 9, wherein the data determination block is configured to adjust the level of the reference voltage based on an accumulated average of levels of a plurality of mute intervals and a plurality of signal intervals of the amplified receive signal.

11. The near field communication device of claim 10, wherein when the accumulated average increases, the data determination block is configured to increase the level of the reference voltage, and when the accumulated average decreases, the data determination block is configured to decrease the level of the reference voltage.

12. The near field communication device of claim 10, wherein the data determination block is configured to add a weight to levels of a currently determined mute level and a currently determined signal interval from among the plurality of mute intervals and the plurality of signal intervals to determine the accumulated average.

13. The near field communication device of claim 10, wherein the data determination block is configured to determine the accumulated average by accumulating a predetermined number of levels of the plurality of mute intervals and the plurality of signal intervals based on a first-in first-out scheme.

14. The near field communication device of claim 8, wherein the data determination block is configured to reset the level of the reference voltage to an initial value periodically, when a communication failure occurs or in response to a request of an external device.

15. A near field communication device comprising:
an amplifier configured to amplify a signal received through an antenna and to output the signal as an amplified receive signal;
a gain control block configured to adjust a gain of the amplifier based on a result of comparing the amplified receive signal with a first reference voltage during a noise reception sequence, and to adjust the gain of the amplifier based on a result of comparing the amplified receive signal with a second reference voltage during a signal reception sequence,
wherein the noise reception sequence includes a time interval in which an information signal is not included in the signal received through the antenna; and
a data determination block configured to determine whether the amplified receive signal includes data during the signal reception sequence based on a level of noise included in the amplified receive signal during the noise reception sequence, to determine the data by comparing the amplified receive signal with a third reference voltage during the signal reception sequence, and to adjust the third reference voltage based on a level of the amplified receive signal.

16. A near field communication device comprising:
an amplifier configured to amplify a signal received through an antenna and to output the signal as an amplified receive signal;
a gain control block configured to adjust a gain of the amplifier based on a level of a noise included in the amplified receive signal during a noise reception sequence,
wherein the noise reception sequence includes a time interval in which an information signal is not included in the signal received through the antenna; and
a data determination block configured to determine a noise threshold voltage based on the level of the noise of the amplified receive signal during the noise reception sequence, to determine whether the amplified receive signal includes a signal reception sequence using the noise threshold voltage, to determine data by comparing the amplified receive signal with a data threshold during the signal reception sequence, and to adjust the data threshold based on a level of the amplified receive signal.

17. The near field communication device of claim 16, wherein the data determination block is configured to determine the noise threshold voltage as a result obtained by adding a margin value to the level of the amplified receive signal during the noise reception sequence.

18. The near field communication device of claim 16, wherein the data determination block is configured to determine an interval in which a level of the amplified receive signal is lower than the data threshold as a mute interval, and an interval in which the level of the amplified receive signal is not lower than the data as a signal interval, and
wherein the data determination block is further configured to determine the data based on a determined order of the mute interval and the signal interval in the amplified receive signal.

19. The near field communication device of claim 16, wherein the data determination block is configured to adjust the level of the data threshold based on an accumulated average of levels of intermediate values of patterns of the amplified receive signal.

20. The near field communication device of claim 16, wherein the gain control block is configured to adjust a gain of the amplifier based on a result of comparing the amplified receive signal with a first reference voltage during the noise reception sequence, and to adjust the gain of the amplifier based on a result of comparing the amplified receive signal with a second reference voltage during the signal reception sequence.

* * * * *